United States Patent [19]
Ting

[11] Patent Number: 5,563,831
[45] Date of Patent: Oct. 8, 1996

[54] TIMING REFERENCE CIRCUIT FOR BITLINE PRECHARGE IN MEMORY ARRAYS

[75] Inventor: Tah-Kang J. Ting, Hsinchu, Taiwan

[73] Assignee: Etron Technology Inc., Hsinchu, Taiwan

[21] Appl. No.: 521,455

[22] Filed: Aug. 30, 1995

[51] Int. Cl.$^6$ .................................................. G11C 7/00
[52] U.S. Cl. .................. 365/189.09; 365/189.11
[58] Field of Search ................ 365/189.09, 189.11, 365/203, 226

[56] References Cited

U.S. PATENT DOCUMENTS 4,787,066 11/1988 Leuschner ..................... 365/189.11
5,361,237 11/1994 Chishiki ......................... 365/189.09
5,367,489 11/1994 Park ................................ 365/189.09

*Primary Examiner*—A. Zarabian
*Attorney, Agent, or Firm*—George O. Saile; Larry J. Prescott

[57] ABSTRACT

In memory arrays using MOSFET technology the bitlines and inverse bitlines must be precharged to an initial value before the beginning of the active period of the memory cycle. The time required to precharge the bitlines and inverse bitlines is not a useful part of the memory cycle and it is desirable to keep the precharge time as low as possible. This invention provides circuits and a method of maintaining a higher voltage at the gates of the isolation MOSFETs in the memory array during the precharge period and returning the voltage to a lower level before the end of the inactive period, thereby significantly reducing the precharge time.

15 Claims, 6 Drawing Sheets

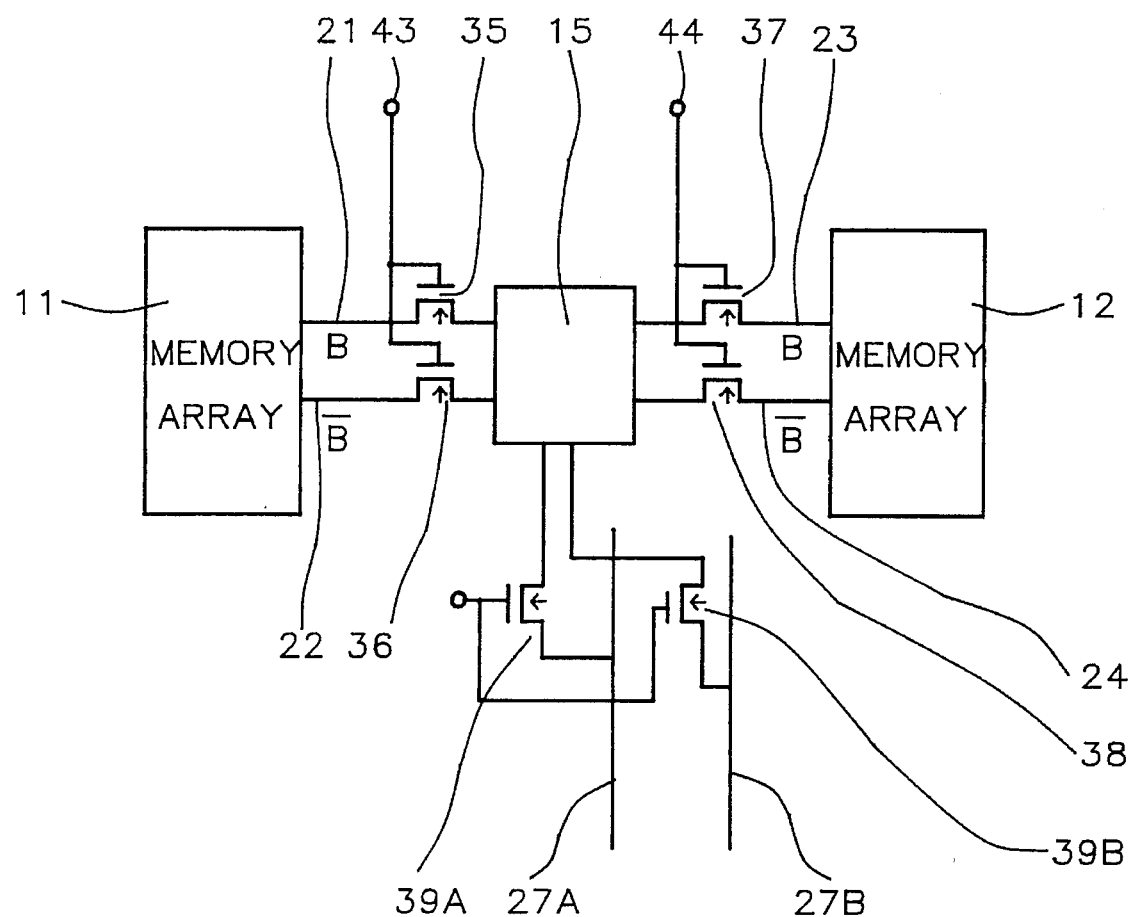
FIG. 1 - Prior Art

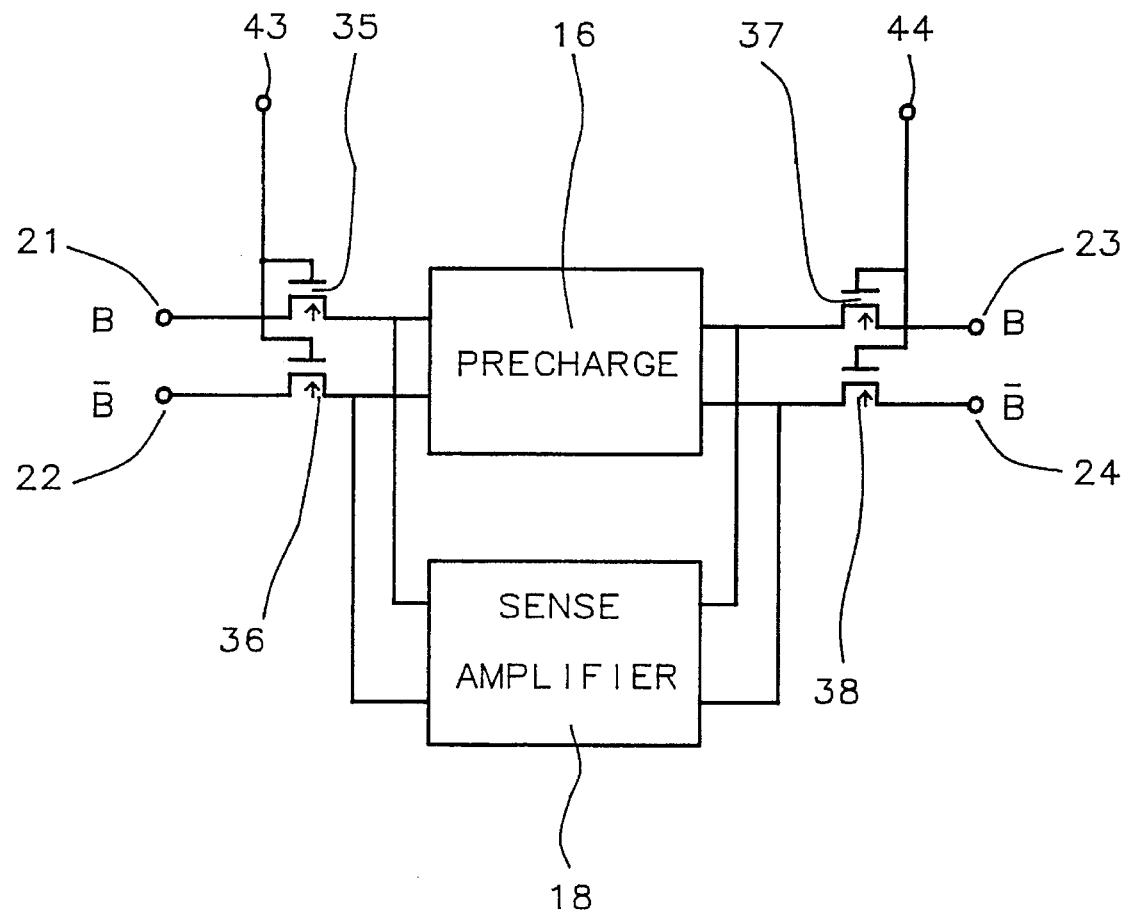
FIG. 2 - Prior Art

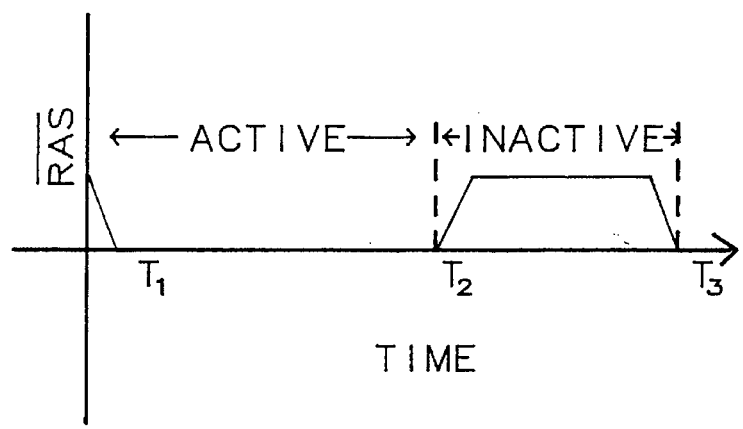
FIG. 3a - Prior Art
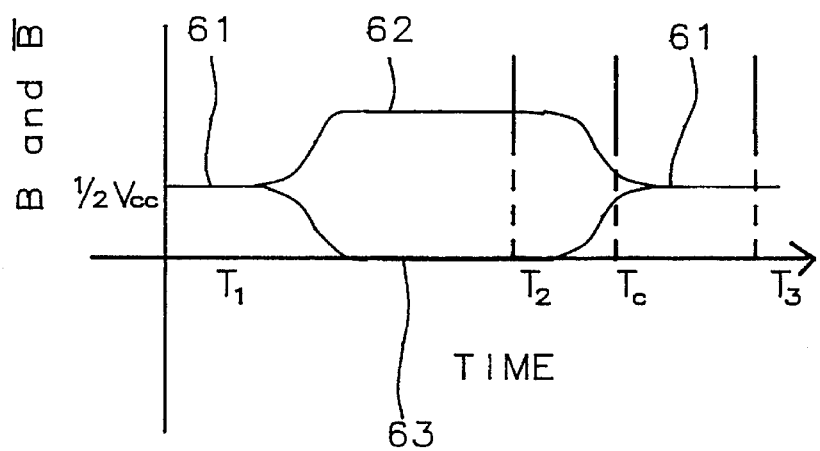
FIG. 3b - Prior Art
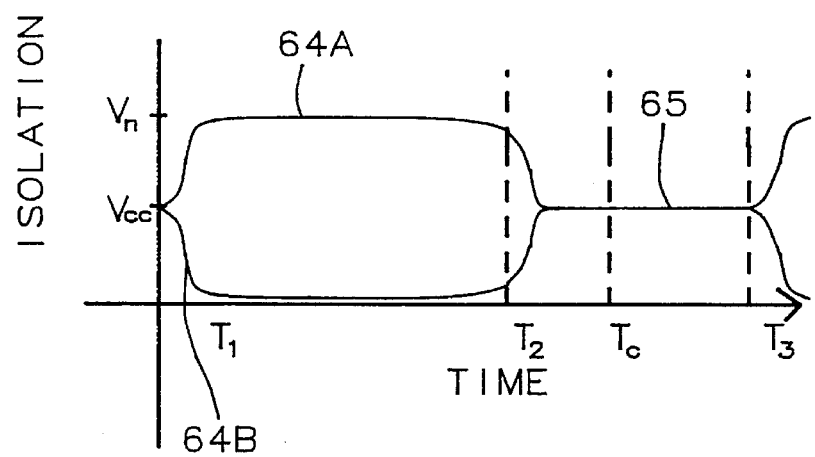
FIG. 3c - Prior Art

TIMING REFERENCE CIRCUIT FOR BITLINE PRECHARGE IN MEMORY ARRAYS

BACKGROUND OF THE INVENTION

1. Field of the Invention

The invention relates to a timing reference circuit for bitline precharge for random access memory arrays such as dynamic random access memory, DRAM, arrays. The invention provides a high voltage at the gates of isolation metal oxide semiconductor field effect transistors, MOSFETs, during the period of time the bitlines and inverse bitlines are being precharged. The voltage at the gates of the isolation MOSFETs is automatically returned to a lower level when the precharge of the bitlines and inverse bitlines is complete.

2. Description of Related Art

The memory cycle of memory arrays using MOSFET technology is divided into an active period and an inactive period. At the beginning of the active period the bitlines and inverse bitlines of the memory array must be precharged to an initial voltage level. During the active period the memory cells are accessed and the bitline goes to a high voltage level and the inverse bitline goes to a low voltage level or the bitline goes to a low voltage level and the inverse bitline goes to a high voltage level depending on the initial state of the cell. During the inactive period of the memory cycle the bitline and the inverse bitline must be precharged back to the initial voltage level in preparation for the next active period.

The bitline and inverse bitline are precharged with current flowing through isolation MOSFETs. Conventional methods provide means to raise the voltage at the gates of the isolation MOSFETs during the active period of the memory cycle and returning this voltage to a lower level during the inactive period of the memory cycle, but this does not help reduce the time required to precharge the bitline and inverse bitline.

This invention provides circuits and a method of maintaining the higher voltage at the gates of the isolation MOSFETs during the precharge period and returning the voltage to a lower level before the end of the inactive period, thereby reducing the precharge time.

SUMMARY OF THE INVENTION

Memory arrays, such as dynamic random access memory or DRAM arrays, frequently are divided into two sections 11 and 12, as shown in FIG. 1, with each section having a bitline 21 and 23 and an inverse bitline 22 and 24. The bitline and inverse bitline are connected through an isolation metal oxide semiconductor field effect transistor, or MOSFET, 35, 36, 37, and 38 to a shared sense amplifier 15. The output of the shared sense amplifier 15 is connected through a bit switch MOSFET 39A to a data line 27A or through a bit switch MOSFET 39B to an inverse data line 27B.

The memory cycle consists of an active period and an inactive period as shown in FIG. 3A. Information is either read from the memory cell or stored in the memory cell during the active period. As shown in FIG. 3B, during the active period either the bitline goes to a high voltage level 62, such as the $V_{cc}$ supply voltage level, and the inverse bitline goes to a low voltage level 63, such as ground, or the inverse bitline goes to the high voltage level and the bitline goes to the low voltage level depending on the state of the memory cell. During the inactive period of the memory cycle the bitline and inverse bitline, which have a significant capacitance to ground, must be precharged to an initial value 61, such as one half the $V_{cc}$ supply voltage level, before the active period can begin again.

FIG. 2 shows a block diagram of a conventional precharge circuit 16 and sense amplifier circuit 18 for two bitlines 21 and 23, and two inverse bitlines 22 and 24 feeding two sections of the memory array, not shown. An isolation MOSFET 35, 36, 37, and 38 is in series with each bitline and inverse bitline between the bitlines and inverse bitlines and the precharge circuit 16. The precharge current must flow through the isolation MOSFETs 35, 36, 37, and 38 to precharge the bitlines and inverse bitlines. Since the isolation MOSFETs are usually small due to space limitations the precharge current is limited and the precharge time is extended.

A common practice, see FIG. 2 and FIG. 3C, for the isolation voltage 43 44 is to increase the voltage to the gates of the isolation MOSFETs of the selected array to a higher level 64A, $V_h$, and to decrease the voltage to the gates of the isolation MOSFETs of the unselected array to a lower voltage level 64B during the active period of the memory cycle. The isolation voltages must be returned to the $V_{cc}$ supply level 65 during the inactive period of the memory cycle before the beginning of the next active period, so this increased isolation voltage does not help reduce the bitline precharge time. A shorter precharge time would permit a smaller inactive period and better memory performance.

It is a principle objective of this invention to provide a precharge timing reference circuit which will produce a high isolation voltage during the time of the inactive period the bitlines and inverse bitlines are being precharged and return the isolation voltage to a lower voltage level when the precharge of the bitlines and inverse bitlines is completed.

It is a further objective of this invention to provide a method of bitline and inverse bitline precharge which will reduce the time required to precharge the bitlines and inverse bitlines.

These objectives are achieved by means of a timing reference circuit comprised of a charging circuit, a level shifting circuit, and a high voltage generator circuit. At the beginning of the inactive period of the memory cycle the charging circuit begins charging a reference capacitor which has been fully discharged during the active period of the memory cycle. The reference capacitor has the same capacitance as the bitline capacitance to ground and is charged by a charging current through a charging MOSFET which is the same size as the isolation MOSFET. The gate of the charging MOSFET and the gates of the isolation MOSFETs are connected to the output of the high voltage generator circuit. The output of the high voltage generator circuit is at a high isolation voltage level, $V_h$, during the active period and the beginning of the inactive period of the memory cycle. At the beginning of the inactive period the reference capacitor and the bitlines and inverse bitlines begin charging and will all charge at the same rate. When the voltage on the reference capacitor reaches the initial bitline voltage, which will be the same time the bitlines and inverse bitlines reach the initial bitline voltage, the level shifting circuit changes the input level to the high voltage generator circuit and the output of the high voltage generator circuit, which is also the voltage supplied to the gates of the isolation MOSFETs and the gate of the charging MOSFET, is reduced to a low isolation voltage level, such as the $V_{cc}$ voltage supply level, for the remainder of the inactive period. At the beginning of the active period the output of the high voltage generator circuit switches back to the high isolation voltage level, $V_h$.

This invention allows a higher voltage to be applied to the gates of the isolation MOSFETs during bitline precharge which shortens the time required to precharge the bitlines. This allows the inactive period of the memory cycle to be shortened. Reductions of time required to precharge bitlines, $t_{RP}$, from 40 nanoseconds to 25 nanoseconds have been achieved.

BRIEF DESCRIPTION OF THE DRAWINGS

FIG. 1 is block diagram of a conventional scheme having tow memory arrays feeding a shared sense amplifier.

FIG. 2 is a block diagram of a conventional precharge circuit, isolation MOSFETs, and sense amplifier arrangement interconnecting bitlines and inverse bitlines of two memory arrays.

FIG. 3A is a timing diagram showing the active and inactive periods of a conventional memory cycle.

FIG. 3B is a timing diagram showing the bitline and inverse bitline voltage during the active and inactive periods of a conventional memory cycle.

FIG. 3C is a timing diagram showing the voltage on the gates of isolation MOSFETs during the active and inactive periods of a conventional memory cycle.

DESCRIPTION OF THE PREFERRED EMBODIMENTS

Figure 4:
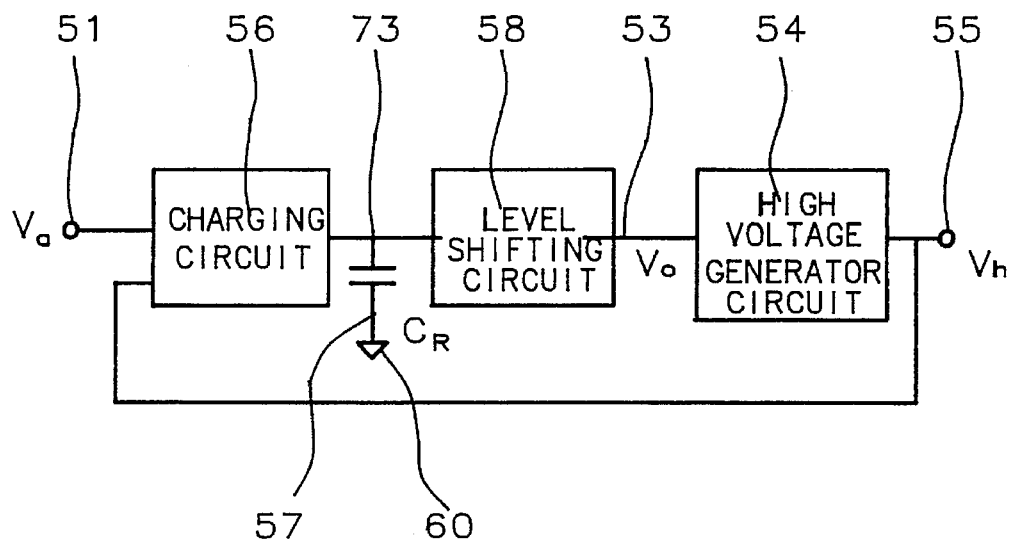
FIG. 4 is a block diagram showing the charging circuit, level shifting circuit, and high voltage generator circuit of this invention.
Figure 5:
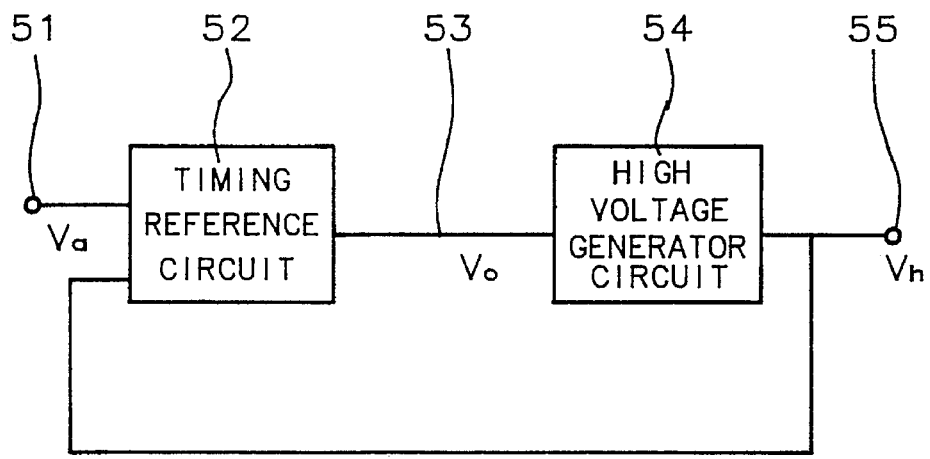
FIG. 5 is a block diagram showing the timing reference circuit and high voltage generator circuit of this invention.
Figure 6:
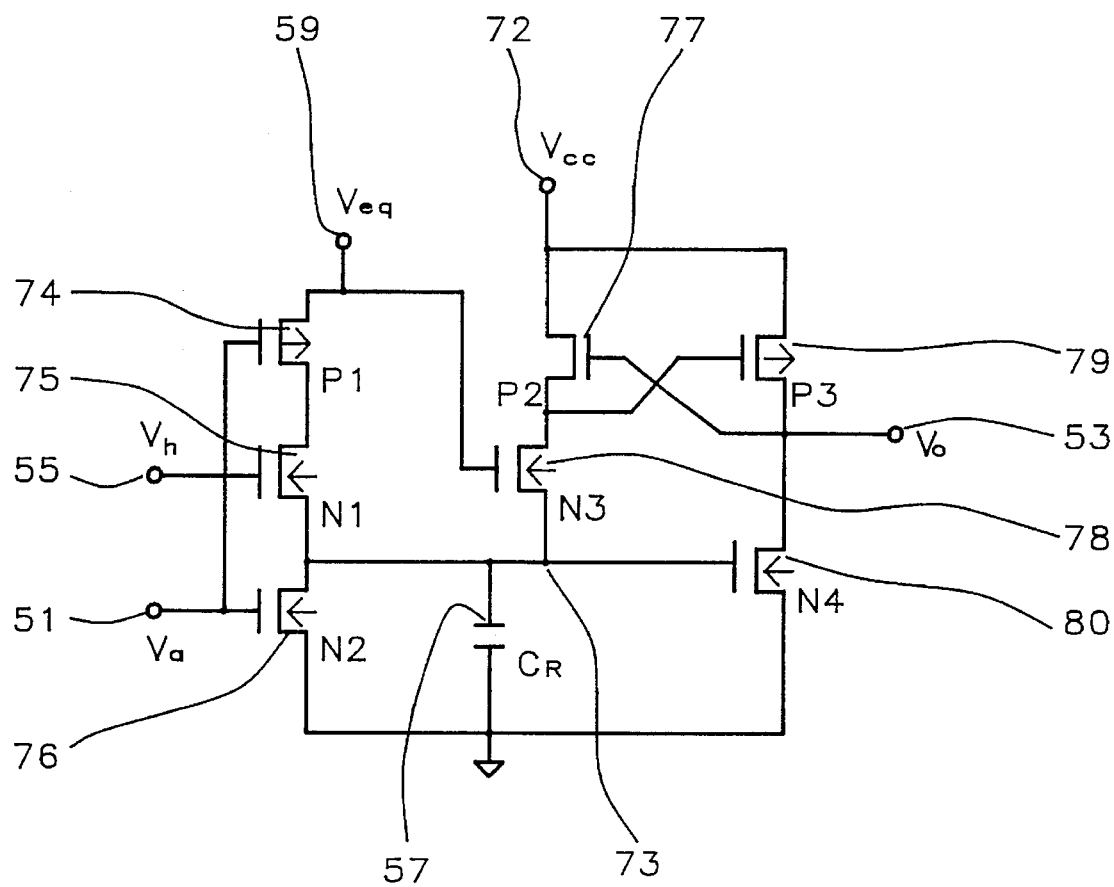
FIG. 6 is a schematic diagram of the timing reference circuit of this invention.

Refer now to FIGS. 4, 5, and 6, there is shown a block diagram and a schematic diagram of a preferred embodiment of the timing reference circuit of this invention. FIG. 4 shows a block diagram of the charging circuit 56, reference capacitor 57, level shifting circuit 58, and high voltage generator circuit 54 of this invention. The charging circuit 56 has a first input and a second input. The first input of the charging circuit is connected to the output 55 of the high voltage generator circuit 56. The second input 51 of the charging circuit 56 is connected to a timing voltage source, $V_a$, having a logical one voltage level during the active period of the memory cycle and a logical zero voltage level during the inactive period of the memory cycle. The output 73 of the charging circuit 56 is connected to one terminal of the reference capacitor 57 with the other terminal of the reference capacitor 57 connected to the ground node 60.

During the active period of the memory cycle the output 73 of the charging circuit 56 is at ground potential and the reference capacitor 57 is discharged. During the inactive period the voltage of the timing voltage source, $V_a$, switches to a logical zero voltage level and the charging circuit begins to charge the reference capacitor 57 and the voltage at the output 73 of the charging circuit 56 and the input 73 of the level shifting circuit 58 begins to increase. When the voltage at the input of the level shifting circuit reaches a reference voltage level the output 53 of the level shifting circuit 58, which is reset to a logical one voltage level at the beginning of the active period of the memory cycle, switches from a logical one voltage level to a logical zero voltage level. The output 53 of the level shifting circuit 58 is connected to the input of the high voltage generator circuit 54. The output 55 of the high voltage generator circuit 54 is at a high isolation voltage level when the input of the high voltage generator circuit is at a logical one voltage level and at a low isolation voltage level when the input of the high voltage generator circuit is at a logical zero voltage level.

The output of the high voltage generator circuit 54 is connected to the first input of the charging circuit 56 and to the gates of the isolation MOSFETs of a memory array. The reference capacitor 57 has the same, or slightly larger capacitance as the bitline capacitance of the memory array. The reference capacitor is charged by current flowing through a MOSFET which is the same size as the isolation MOSFETs of the memory array. The reference voltage which caused the level shifting circuit to switch is the voltage to which the bitlines of the memory array are precharged. The reference capacitor will thus be charged to the reference voltage at the same time the bitline is precharged and the voltage supplied to the gates of the isolation MOSFETs will be at the high isolation voltage level when the bitlines are being precharged and will switch to the low isolation voltage level when precharge of the bitlines has been completed.

FIG. 5 shows another block diagram of the timing reference circuit of this invention. In this diagram the charging circuit 56, the reference capacitor 57, and the level shifting circuit 58 of FIG. 4 are incorporated into the timing reference circuit 52 of FIG. 5. The circuit operation is the same as previously described.

Refer now to FIG. 6, there is shown a schematic diagram of timing reference circuit made up of the charging circuit, reference capacitor, and level shifting circuit of this invention. The charging circuit is made up of a first P channel MOSFET 74, a first N channel MOSFET 75, and a second N channel MOSFET 76. The level shifting circuit is made up of a second P channel MOSFET 77, a third P channel MOSFET 79, a third N channel MOSFET 78, and a fourth N channel MOSFET 80. The reference capacitor 57 is connected between the source and drain of the second N channel MOSFET 76 and the gate and source of the fourth N channel MOSFET 80. The gate of the first N channel MOSFET 75 is connected to the output of the high voltage generator circuit, $V_h$, 55. The high voltage reference circuit is not shown in FIG. 6. The gate of the second N channel MOSFET 76 is connected to the timing voltage source, $V_a$, 51. The gate of the third N channel MOSFET 78 is connected to a reference voltage source, $V_{eq}$, 59 which is about one half of the voltage level of the $V_{cc}$ supply voltage 72 which supplies the level shifting circuit. For example $V_{cc}$ is about 3.3 volts and $V_{eq}$ is about 1.7 volts.

During the active period of the memory cycle the timing voltage source, $V_a$, 51 is at the logical one voltage level, the second N channel MOSFET 76 is turned on, the first P channel MOSFET 74 is turned off, the reference capacitor 57 is discharged, the level shifting circuit output voltage, $V_o$, 53 is at a logical one voltage level, and the output of the high voltage generator circuit, not shown in FIG. 6, is at the high isolation voltage level of, for example, about 6.0 volts. At the beginning of the inactive period of the memory cycle the timing voltage source, $V_a$, 51 switches to the logical zero voltage level, the second N channel MOSFET 76 is turned off, the first P channel MOSFET 74 is turned on, the voltage supplied by the high voltage generator circuit, $V_h$, 55 is at the high isolation voltage level of about 6.0 volts, the first N channel MOSFET 75 is turned on, and the reference capacitor 57 begins to charge due to current flow through the first N channel MOSFET 75.

During the first part of the inactive period, when the reference capacitor is beginning to charge, the output of the level shifting circuit, $V_o$, 53 remains at a logical one voltage level and the voltage supplied by the high voltage generator circuit remains at the high isolation voltage level of about 6.0 volts. As the voltage on the reference capacitor 57 increases to the reference voltage, $V_{eq}$, 59 the output 53 of the level shifting circuit switches to the logical zero voltage level and the output voltage from the high voltage generating circuit switches to the low isolation voltage level of the $V_{cc}$ supply voltage, for example about 3.3 volts. The reference voltage, $V_{eq}$, 59 is one half the $V_{cc}$ supply voltage, about 1.7 volts, and is the voltage to which the bitlines and inverse bitlines of the memory array are being precharged.

The first N channel MOSFET 75 is the same size as the isolation MOSFETs of the memory array, the reference capacitor has a capacitance the same or slightly larger than the bitline capacitance to ground, and the reference voltage, $V_{eq}$, is the voltage to which the bitlines and inverse bitlines are being precharged. The high voltage generator output voltage will then switch from the high isolation voltage level to the low isolation voltage level at about the same time the precharge of the bitlines and inverse bitlines is completed, or slightly later if the capacitance of the reference capacitor is slightly larger than the bitline capacitance.

Figure 7A:
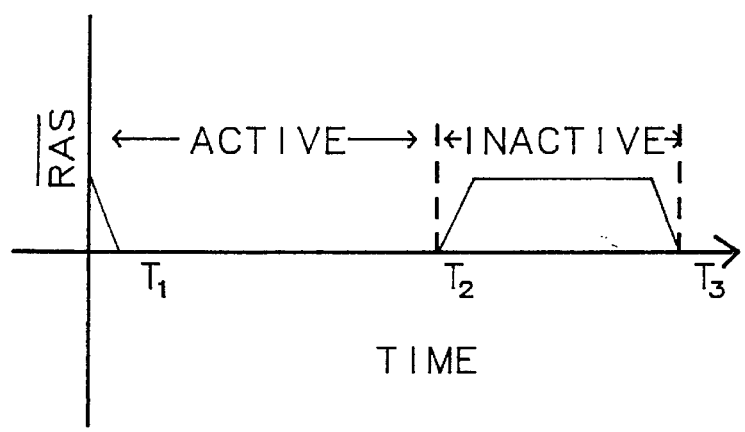
FIG. 7A is a timing diagram showing the active and inactive periods of the memory cycle of this invention.
Figure 7B:
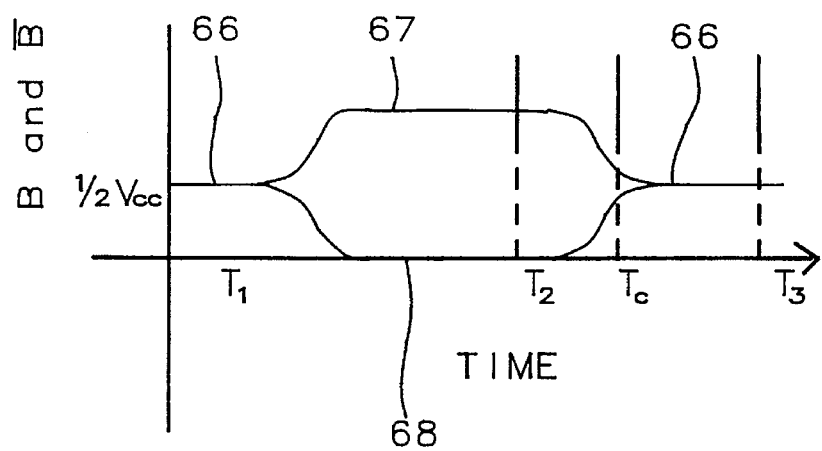
FIG. 7B is a timing diagram showing the bitline and inverse bitline voltage during the active and inactive periods of the memory cycle of this invention.
Figure 7C:
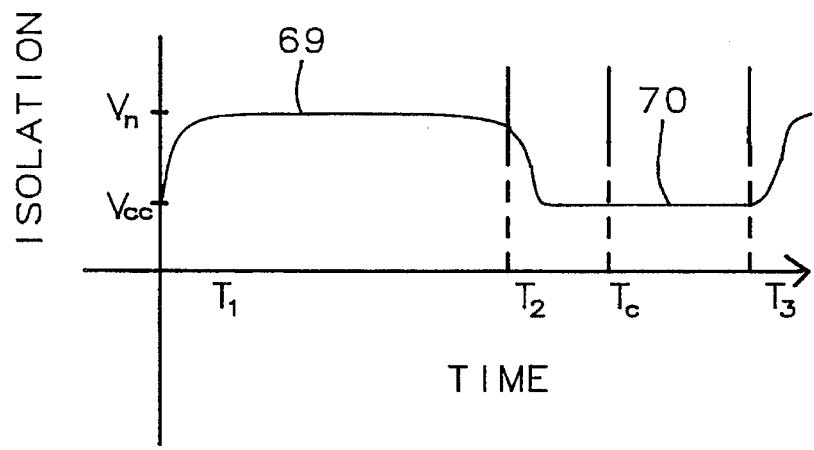
FIG. 7C is a timing diagram showing the voltage on the gates of isolation MOSFETs during the active and inactive periods of the memory cycle of this invention.

Refer now to FIGS. 7A–7C, there is shown the timing diagrams for method of bitline precharge of this invention. FIG. 7A shows the active period and inactive periods of the memory cycle. FIG. 7B shows the bitline at the high voltage level 67 and the inverse bitline at the low voltage level 68, or the bitline at the low voltage level 68 and the inverse bitline at the high voltage level 67 during the active period of the memory cycle and both the bitline and inverse bitline being precharged to one half the $V_{cc}$ supply level 66 during the inactive period of the memory cycle. FIG. 7C shows the voltage at the gates of the isolation MOSFETs of the memory array at the high isolation voltage level of about 6.0 volts during the active period of the memory cycle and the first part of the inactive period of the memory cycle and switching to the low isolation voltage level of about 3.3 volts after the precharge of the bitlines and inverse bitlines has been completed. Using the above described circuits and method the time required for the precharge of the bitlines and inverse bitlines has been reduced from about 40 nanoseconds to about 25 nanoseconds.

While the invention has been particularly shown and described with reference to the preferred embodiments thereof, it will be understood by those skilled in the art that various changes in form and details may be made without departing from the spirit and scope of the invention.

What is claimed is:

1. A timing reference circuit, comprising:

a charging circuit having a first input, a second input, and an output;

a timing voltage source having a logical one voltage level during an active period of a memory cycle and a logical zero voltage level during an inactive period of said memory cycle connected to said second input of said charging circuit;

a ground node;

a reference capacitor having a first terminal connected to said output of said charging circuit and a second terminal connected to said ground node wherein said reference capacitor is discharged when said timing voltage source has said logical one voltage level, and said reference capacitor is charged to a reference voltage when said timing voltage source has said logical zero level;

a level shifting circuit having an input and an output wherein said input of said level shifting circuit is connected to said first terminal of said reference capacitor and the voltage at said output of said level shifting circuit has said logical one voltage level when said reference capacitor is discharged or charged to a voltage level less than said reference voltage and said logical zero voltage level when said reference capacitor is charged to a voltage level of said reference voltage or greater; and a high voltage generator circuit having an input and an output wherein input of said high voltage generating circuit is connected to said output of said level shifting circuit, said output of said high voltage generator circuit is connected to said first input of said charging circuit, and the voltage at said output of said high voltage generator circuit is at a high isolation voltage level when the voltage at said output of said level shifting circuit is said logical one voltage level and at a low isolation voltage level when the voltage at said output of said level shifting circuit is said logical zero voltage level.

2. The timing reference circuit of claim 1 wherein said high isolation voltage level is between about 4 and 6 volts.

3. The timing reference circuit of claim 1 wherein said low isolation voltage level is between about 2.5 and 4 volts.

4. The timing reference circuit of claim 1 wherein said reference voltage is between about 1.25 and 2 volts.

5. The timing reference circuit of claim 1 wherein said timing reference circuit is used with a memory array bitline having a capacitance to ground and the capacitance of said reference capacitor is between about 0.5 and 2 times said memory array bitline capacitance to ground.

6. The timing reference circuit of claim 1 wherein said reference capacitor is charged by means of current flowing through a control metal oxide semiconductor field effect transistor having a source, a drain, and a gate wherein said gate is connected to said output of said high voltage generator circuit.

7. The timing reference circuit of claim 6 wherein said timing reference circuit is used with a memory array having an isolation metal oxide semiconductor field effect transistor in series with a bitline and said control metal oxide semiconductor field effect transistor is about the same size as said isolation metal oxide semiconductor field effect transistor.

8. A method of memory array bitline precharge, comprising:

providing a timing voltage source having a logical one voltage level during an active period of a memory cycle and a logical zero voltage level during an inactive period of said memory cycle;

providing a memory array having a bitline wherein said bitline has a capacitance to ground;

providing a bitline precharge circuit wherein said memory array bitline capacitance to ground is charged to a reference voltage when said timing voltage source has said logical zero level;

providing an isolation metal oxide semiconductor field effect transistor having a gate, a source, and a drain wherein said source and drain of said isolation metal oxide semiconductor field effect transistor are connected in series with said memory array bitline and said bitline precharge circuit;

providing a charging circuit having a first input, a second input, and an output wherein said second input of said charging circuit is connected to said timing voltage source;

providing a ground node;

providing a reference capacitor having a first terminal connected to said output of said charging circuit and a second terminal connected to said ground node wherein said reference capacitor is discharged when said timing voltage source has said logical one voltage level, and said reference capacitor is charged to said reference voltage when said timing voltage source has said logical zero level;

providing a level shifting circuit having an input and an output wherein said input of said level shifting circuit is connected to said first terminal of said reference capacitor and the voltage at said output of said level shifting circuit has said logical one voltage level when said reference capacitor is discharged or charged to a voltage level less than said reference voltage and said logical zero voltage level when said reference capacitor is charged to a voltage level of said reference voltage or greater;

providing a high voltage generator circuit having an input and an output wherein said input of said high voltage generating circuit is connected to said output of said level shifting circuit, said output of said high voltage generator circuit is connected to said first input of said charging circuit, and the voltage at said output of said high voltage generator circuit is at a high isolation voltage level when the voltage at said output of said level shifting circuit is said logical one voltage level and at a low isolation voltage level when the voltage at said output of said level shifting circuit is said logical zero voltage level; and connecting said output of said high voltage generator circuit to said gate of said isolation metal oxide semiconductor field effect transistor thereby reducing the time required to charge said memory array bitline capacitance to ground to said reference voltage.

9. The method of claim 8 wherein said high isolation voltage level is between about 4 and 6 volts.

10. The method of claim 8 wherein said low isolation voltage level is between about 2.5 and 4 volts.

11. The method of claim 8 wherein said reference voltage is between about 1.25 and 2 volts.

12. The method of claim 8 wherein the capacitance of said reference capacitor is between about 0.5 and 2 times the capacitance of said memory array bitline capacitance to ground.

13. The method of claim 8 wherein said reference capacitor is charged by means of current flowing through a control metal oxide semiconductor field effect transistor having a source, a drain, and a gate wherein said gate is connected to said output of said high voltage generator circuit.

14. The method of claim 13 wherein said control metal oxide semiconductor field effect transistor is about the same size as said isolation metal oxide semiconductor field effect transistor.

15. The method of claim 8 wherein said memory array is a dynamic random access memory array.

\* \* \* \* \*